Nov. 28, 1961 K. HINRICHS ET AL 3,011,132

DIGITALLY OPERABLE POTENTIAL DIVIDER

Filed Oct. 13, 1958

INVENTORS
KARL HINRICHS
JEROME V. WHITE
BY THEIR ATTORNEYS
HARRIS, KIECH, FOSTER & HARRIS

Patented Nov. 28, 1961

3,011,132

DIGITALLY OPERABLE POTENTIAL DIVIDER

Karl Hinrichs, Anaheim, and Jerome V. White, Whittier, Calif., assignors to Beckman Instruments, Inc., a corporation of California Filed Oct. 13, 1958, Ser. No. 766,919
6 Claims. (Cl. 330—106)

This invention relates to a variable potential divider that can be digitally controlled either by manual operation or by a digital selecting device.

It is an object of the invention to provide a potential divider having a large number of digitally controlled voltage ratios which differ by integer multiples of a unit value. A further object is to provide such a divider which may be used with various digital systems, such as binary, decimal, arithmetic, and the like. A further object is to provide such a divider which may be used with digital codes having any number of digits and also with various types of codes such as 8—4—2—1, 2—4—2—1, and the like.

It is an object of the invention to provide a digitally controlled potential divider operable over a particular range within the over-all range available, i.e., a potential divider having a predetermined maximum and minimum voltage ratio within a much greater possible voltage ratio span. A further object is to provide such a potential divider in which the magnitude of the operating voltage ratio range can be selected and changed. Another object of the invention is to provide such a potential divider in which the position of the voltage ratio range can be determined and selected, i.e., change the actual maximum and minimum values while maintaining the ratio of maximum to minimum constant.

It is an object of the invention to provide a digitally controlled potential divider which can be used for controlling the gain in an amplifier circuit with the gain being a function of the voltage ratio of the divider. A further object is to provide a digitally controlled variable gain amplifier circuit having a maximum gain value to prevent saturation of the amplifier. A further object is to provide a digitally controlled variable gain amplifier having a large number of digitally selectable gains within a limited gain range.

It is an object of the invention to provide a digitally controlled variable gain amplifier in which the width of the gain range can be predetermined and selected. Another object is to provide such an amplifier in which the maximum and minimum gains can be predetermined and selected while maintaining the gain range constant.

It is an object of the invention to provide a digitally controlled potential divider having a source terminal, a tap terminal, and a common terminal, a plurality of impedances, with one end of each impedance connected to the tap terminal, switching means for selectively and independently connecting the other end of selected ones of said impedances to either said source or common terminals to connect the impedances in a series-parallel circuit across the source and common terminals, a first additional impedance connected between the tap and source terminals, and a second additional impedance connected between the tap and common terminals, whereby the ratio of the voltage at the tap terminal to the voltage at the source terminal is varied between predetermined maximum and minimum values. A further object of the invention is to provide such a divider which may be connected across the output of an amplifier which provides the source voltage, with the tap terminal serving as a feedback point to produce a feedback amplifier circuit.

The invention also comprises novel details of circuitry and novel combinations and arrangements of elements, which will more fully appear in the course of the following description. The drawing merely shows and the description merely describes a preferred embodiment of the present invention which is given by way of illustration or example.

Figure 1:
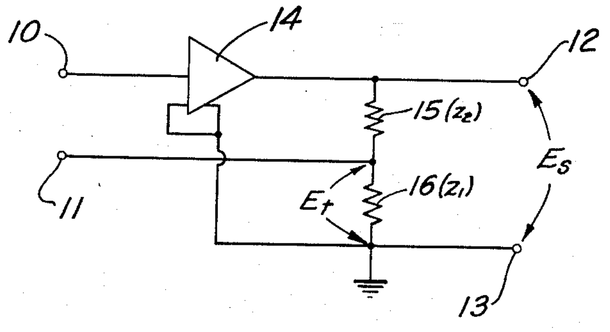
FIG. 1 is a diagram of a conventional feedback amplifier circuit.

The feedback amplifier circuit of FIG. 1 includes input terminals 10, 11, output terminals 12, 13, an amplifier 14, and impedances 15, 16. This is a typical feedback amplifier circuit with the amplifier 14 being a high gain amplifier so that the gain of the circuit is dependent on the relative values of the impedances 15 and 16.

The impedances 15, 16 may be considered a potential divider, with the terminal 12 serving as the source terminal, the terminal 11 the tap terminal, and the terminal 13 the common terminal. A source voltage $E_s$ is applied across the source and common terminals 12, 13, and a tap voltage $E_t$ is developed across the tap and common terminals 11, 13. In the circuit of FIG. 1, the source voltage corresponds to the output of the amplifier circuit and the tap voltage to the feedback voltage. The ratio of the tap voltage to the source voltage is a function of the magnitudes of the serially connected impedances 15, 16 and is:

$$\frac{E_t}{E_s}=\frac{Z_1}{Z_1+Z_2}$$

where $Z_1$ is the value of the impedance 16 and $Z_2$ is the value of the impedance 15. In the following discussion, it is more convenient to describe the invention in terms of admittance rather than impedance, the admittance of an element being equal to the reciprocal of the impedance of the element. In terms of admittance, the voltage ratio is:

$$\frac{E_t}{E_s}=\frac{A_2}{A_1+A_2}$$

The expression $E_t/E_s$ is termed the scale of the potential divider and, when used in a feedback amplifier circuit having an amplifier with a very high loop gain, is substantially equivalent to the reciprocal of the gain of the circuit.

A number of impedances may be connected in parallel in place of the impedance 15 and a number of impedances may be connected in parallel in place of the impedance 16. Since the total admittance of a number of impedances connected in parallel is equal to the sum of the admittances of the individual impedances, the scale of such a potential divider may be expressed as follows:

$$\frac{E_t}{E_s}=\frac{\sum A_2}{\sum A_1+\sum A_2}$$

Figure 2:
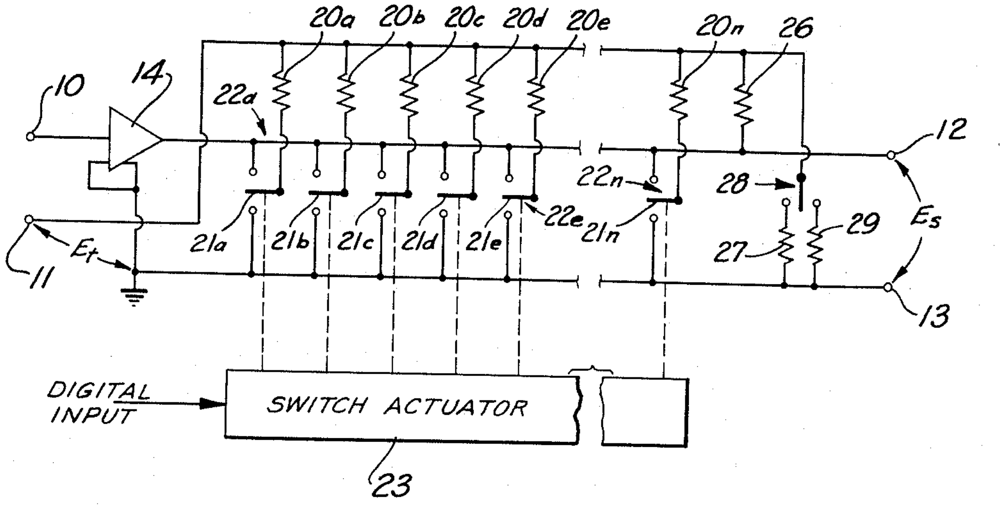
FIG. 2 is a diagram of a feedback amplifier circuit embodying the potential divider of the invention.

Turning now to the circuit of FIG. 2, a plurality of impedances 20*a*–20*n* have been substituted for the impedances 15, 16 of the circuit of FIG. 1. One end of each of the impedances 20 is connected to the tap terminal 11 and the other end is connected to the moving arm 21*a*–21*n* of a single-pole double-throw switch 22*a*–22*n*. One fixed contact of each switch is connected to the source terminal 12 and the other fixed contact of each switch is connected to the common terminal 13. A switch actuator 23 actuates the moving arms 21 of the switches 22 to selectively and independently connect selected ones of the impedances 20*a*–20*n* either to the source terminal 12 or the common terminal 13, in any desired order, to provide a series-parallel arrangement of the impedances.

An additional impedance 26 is connected between the tap terminal and the source terminal. An additional impedance 27 is connected between the common terminal 13 and one fixed contact of a switch 28 and another additional impedance 29 is connected between the common terminal 13 and another fixed contact of the switch 28, with the moving arm of the switch connected to the tap terminal 11. The scale of the potential divider of FIG. 2 will be:

$$\frac{E_t}{E_s}=\frac{\sum A_{ts}}{\sum A_{tc}+\sum A_{ts}}$$

where $A_{ts}$ are the impedances connected to the source terminal and $A_{tc}$ are the impedances connected to the common terminal.

By choosing the admittances of the impedances 20*a*–20*n* in the well known conventional manner, any integer multiple of a minimum scale increment can be selected for the potential divider. For example, sixteen impedances can be used having admittances which are the following integer multiples of a minimum admittance valve: 8000, 4000, 2000, 1000, 800, 400, 200, 100, 80, 40, 20, 10, 8, 4, 2, 1. If the impedances 26 and 29 are omitted and the admittance of the impedance 27 is made equal to the minimum or unit admittance, any integer scale between .0000 and .9999 may be selected by suitably switching the impedances. The scale of .7431 may be set up by switching the impedances having admittance integer multiples of 4000, 2000, 1000, 400, 20, 10, and 1 to the source terminal and switching the remaining impedances to the common terminal. Then the summation of admittances in the numerator of the expression for the scale will be 7431 and the summation of admittances for the denominator will be 9999 plus 1 or 10,000.

In the example discussed in the preceding paragraph, the scale range, and, hence, the gain range of the amplifier circuit, is ten thousand to one. While it is often desirable to have a large number of digitally variable steps available in a potential divider or an amplifier, the divider or amplifier is seldom useable over such a wide range. It has been found that the digitally operated potential divider can be modified to provide a limited range over which the associated amplifier can operate while maintaining a relatively large number of digital steps. It has also been found that the maximum and minimum values of the range can be changed while maintaining the same limited range, when desired.

The impedance 26 is connected between the tap terminal 11 and the source terminal 12 and, hence, appears both in the numerator and denominator of the expression for the scale of the potential divider. This impedance serves two purposes. First, it prevents the scale of the potential divider from being switched to zero and, when the potential divider is used in the feedback loop of an amplifier, prevents an infinite gain setting which would result in rapid saturation of the amplifier even with a very small input signal. Such saturation is undesirable because it would cause the amplifier to be inaccurate for a considerable time even when a new input signal and a new gain value exist.

Second, the impedance 26 provides a control for the magnitude of the range of potential divider scale available. For example, if the admittance of the impedance 26 is selected to be a multiple of 1000 of the unit admittance, the scale range for the previous example is 9.999 to 1. Similarly, if the admittance of the impedance 26 is selected to be a multiple of 100 of the unit admittance, the scale range is 99.99 to 1. Hence, it is seen that the impedance 26 can be connected between the tap terminal and the source terminal of the potential divider to determine the scale range of the potential divider and to determine the gain range of a feedback amplifier circuit which utilizes the potential divider. While the magnitude of the impedance 26 may be made variable to provide different gain ranges in a single circuit, this is ordinarily not done since the gain range will be maintained constant for a particular amplifier.

An important advantage achieved from the above circuit arrangement lies in the fact that over eight thousand discrete values of gain are available in an amplifier circuit having a gain range of less than 10 to 1, this being achieved for the particular example given above with the impedance 26 having the admittance multiple of 1000. Of course, the particular number of discrete gain steps available for a particular gain range is dependent upon the number of switchable impedances utilized and the admittances selected therefor.

In actuating the switches for the potential divider of the invention utilizing the impedance 26, it is necessary to compensate for the presence of the impedance 26. Following the above example, with a digital input of .7431 to the switch actuator 23, and an admittance multiple of 1000 for the impedance 26, the switch actuator will be wired to connect those impedances 20*a*–20*n* having the total multiple of .6431 to the source terminal, since the multiple of 1000 is already so connected.

When the admittance multiple of the impedance 26 is set at a value greater than unity, the desired arithmetical relationship of the scale is disturbed. However, this is compensated for by the impedance 27 which also determines the maximum and minimum scale values obtainable. The admittance value of the impedance 26 is selected to provide the desired range of scales available. Then the admittance value of the impedance 27 is selected to be equal to the product of the admittance value of the impedance 26 and the minimum scale value at which the potential divider is to be operated less the sum of the multiples of the impedances 26 and 20*a*—20*n*. This, of course, also controls the maximum scale value. Since the admittance of impedance 26 appears in both the numerator and denominator of the expression for scale and the admittance of the impedance 27 appears only in the denominator, it is seen from the above expression for scale that the proper arithmetical relationships are maintained while obtaining the desired control on scale and scale range or, when the potential divider is used in an amplifier, on gain and gain range.

Continuing the example given above where the admittance value of the impedance 26 was 1000, suppose that the minimum scale value is to be .01. Then the sum of all the admittance multiples in the divider is 100,000. Subtracting the sum of impedance 20*a*—20*n* and 26, namely 10,999, leaves 89,001 as the admittance multiple for the impedance 27.

In an amplifier circuit it is often desired to be able to operate at different maximum and minimum gain. Hence, the circuit of FIG. 2 is provided with two impedances 27, 29 and a switch 28 for connecting one or the other into the circuit. The value of each impedance so connected is determined in the manner set out above depending upon the desired minimum scale. Other switching arrangements for the range impedances 27, 29 will occur to one skilled in the art. For example, one impedance may be fixed across the tap and common terminals while one or more of other impedances are switched in parallel therewith to provide the desired admittance value.

Hence, it is seen that though the impedance 26 may have an admittance multiple of 1000, a digital scale setting of less than 1000 may be obtained by properly choosing the impedance 27 to provide a minimum scale of .0100 or any other integer value desired.

Although an exemplary embodiment of the invention has been disclosed and discussed, it will be understood that other applications of the invention are possible and that the embodiments disclosed may be subjected to various changes, modifications and substitutions without necessarily departing from the spirit of the invention.

I claim as my invention:

1. In a digitally controlled potential divider having a source terminal, a tap terminal, and a common terminal, the combination of: a plurality of impedances, with one end of each impedance connected to said tap terminal; switching means for selectively and independently connecting the other end of selected ones of said impedances to either of said source and common terminals to connect a first parallel circuit comprising those impedances connected to said source terminal in series with a second parallel circuit comprising those impedances connected to said common terminal so that the ratio of a voltage appearing between said tap terminal and said common terminal to a voltage applied between said source terminal and said common terminal is varied between a maximum value when said switching means connects the other end of each impedance to said source terminal, and a minimum value when said switching means connects the other end of each impedance to said common terminal; means for limiting the range between said minimum and maximum values to a predetermined scale range comprising a first additional impedance connected between said tap and source terminals; and means for determining the minimum value of said voltage ratio comprising a second additional impedance connected between said tap and common terminals.

2. In a digitally controlled potential divider having a source terminal, a tap terminal, and a common terminal, the combination of: a plurality of impedances, with one end of each impedance connected to said tap terminal, said impedances being selected to have admittances that are integer multiples of a unit admittance; means for applying a voltage between said source terminal and said common terminal; switching means for selectively and independently connecting the other end of selected ones of said impedances to either of said source and common terminals to connect a first parallel circuit comprising those impedances connected to said source terminal in series with a second parallel circuit comprising those impedances connected to said common terminal so that the ratio of the voltage appearing between said tap terminal and said common terminal to the voltage applied between said source terminal and said common terminal is varied between a maximum value when said switching means connects the other end of each impedance to said source terminal, and a minimum value when said switching means connects the other end of each impedance to said common terminal; means for limiting the range between said minimum and maximum values to a predetermined scale range comprising a first additional impedance connected between said tap and source terminals; and means for determining the minimum value of said voltage ratio comprising a second additional impedance connected between said tap and common terminals, said additional impedances having admittances that are integer multiples of said unit admittance, with the integer multiple of said second additional impedance being equal to the product of the integer multiple of said first additional impedance and the desired minimum ratio less the sum of the multiples of said plurality of impedance and said first additional impedance.

3. In a digitally controlled potential divider having a source terminal, a tap terminal, and a common terminal, the combination of: a plurality of impedances, with one end of each impedance connected to said tap terminal, said impedances being selected to have admittances that are integer multiples of a unit admittance; means for applying a voltage between said source terminal and said common terminal; switching means for selectively and independently connecting the other end of selected ones of said impedances to either of said source and common terminals to connect a first parallel circuit comprising those impedances connected to said source terminal in series with a second parallel circuit comprising those impedances connected to said common terminal so that the ratio of the voltage appearing between said tap terminal and said common terminal to the voltage applied between said source terminal and said common terminal is varied between a maximum value when said switching means connects the other end of each impedance to said source terminal, and a minimum value when said switching means connects the other end of each impedance to said common terminal; means for limiting the range between said minimum and maximum values to a predetermined scale range comprising a first additional impedance connected between said tap and source terminals; means for determining the particular minimum ratio values at which the divider operates comprising a plurality of second additional impedances and additional switch means for selectively connecting one or more of said second additional impedances between said tap and common terminals, said first and second additional impedances having admittances that are integer multiples of said unit admittance, with the integer multiple of each of said second additional impedances being equal to the product of the integer multiple of said first additional impedance and the minimum voltage ratio less the sum of the multiples of said plurality of impedances and said first additional impedance.

4. In a digitally controlled potential divider having a source terminal, a tap terminal, and a common terminal, the combination of: a plurality of resistors, with one end of each resistor connected to said tap terminal, said resistors being divided into groups of four and selected to have conductance values that are integer multiples of a unit conductance, with the conductance values of said groups increasing in multiples of ten; means for applying a voltage between said source terminal and said common terminal; switching means for selectively and independently connecting the other end of selected ones of said resistors to either of said source and common terminals to connect a first parallel circuit comprising those impedances connected to said source terminal in series with a second parallel circuit comprising those impedances connected to said common terminal; means for limiting the range between said minimum and maximum values to a predetermined scale range comprising a first additional resistor connected between said tap and source terminals and having a conductance value which is an integer multiple of said unit conductance and intermediate the extremes of said plurality of resistors, means for determining the particular minimum ratio values at which the divider operates comprising a plurality of second additional resistors and additional switch means for selectively connecting one or more of said second additional resistors between said tap and common terminals with the particular minimum voltage ratio at which the potential divider operates determined by the particular second additional resistors so connected, each of said second additional resistors having a conductance value which is an integer multiple of said unit conductance and equal to the product of said integer multiple of said first additional resistor and a minimum voltage ratio less the sum of the multiples of said plurality of resistors and said additional resistor; and means for varying the ratio of the voltage appearing between said tap terminal and said common terminal to the voltage applied between said source terminal and said common terminal between maximum and minimum values comprising means for actuating said switching means as a function of a digital input to connect to said source terminal those resistors providing an integer multiple equal to said digital input less the integer multiple of said first additional resistor.

5. In a feedback amplifier circuit having a pair of circuit input terminals and a pair of circuit output terminals, the combination of: an amplifier developing an output across said circuit output terminals with one input of said amplifier connected to one of said circuit output terminals and another input of said amplifier connected to one of said circuit input terminals; a variable gain feedback circuit comprising a plurality of impedances with one end of each impedance connected to the other of said circuit input terminals; switching means for selectively and independently connecting the other end of selected ones of said impedances to either of said circuit output terminals to connect a first parallel circuit comprising those impedances connected to the other of said circuit output terminals in series with a second parallel circuit comprising those impedances connected to said one circuit output terminal so that the gain of said circuit is varied between a maximum value when said switching means connects the other end of each impedance to said one circuit output terminal, and a minimum value when said switching means connects the other end of each impedance to said other circuit output terminal; means for limiting the range between said minimum and maximum values to a predetermined gain range and for preventing an infinite gain setting comprising a first additional impedance connected between said other circuit input terminal and said other circuit output terminal; and means for determining the minimum gain value comprising a second additional impedance connected between said other circuit input terminal and said one circuit output terminal.

6. In a feedback amplifier circuit having a pair of circuit input terminals and a pair of circuit output terminals, the combination of: an amplifier developing an output across said circuit output terminals with one input of said amplifier connected to one of said circuit output terminals and another input of said amplifier connected to one of said circuit input terminals; a variable gain feedback circuit comprising a plurality of resistors, with one end of each resistor connected to the other of said circuit input terminals, said resistors being selected to have conductances that are integer multiples of a unit conductance; switching means for selectively and independently connecting the other end of selected ones of said resistors to either of said circuit output terminals to connect a first parallel circuit comprising those resistors connected to the other of said circuit output terminals in series with a second parallel circuit comprising those resistors connected to said one circuit output terminal; means for limiting the range between said minimum and maximum values to a predetermined gain range and for preventing an infinite gain setting comprising a first additional resistor connected between said other circuit input terminal and the other circuit output terminal and having a conductance value which is an integer multiple of said unit conductance and intermediate the extremes of said plurality of resistors, means for determining the particular minimum gain values of said circuit comprising a plurality of second additional resistors and additional switch means for selectively connecting one or more of said second additional resistors between said other circuit input terminal and said one circuit output terminal with the particular minimum gain at which the circuit operates determined by the particular second additional resistors so connected, each of said second additional resistors having a conductance value which is an integer multiple of said unit conductance and equal to the product of said integer multiple of said first additional resistor and the reciprocal of a maximum gain less the sum of the multiples of said plurality of resistors and said first additional resistors; and means for varying the gain of said circuit between predetermined maximum and minimum values comprising and means for actuating said switching means as a function of a digital input to connect to said other output terminal those resistors providing an integer multiple equal to said digital input less the integer multiple of said first additional resistor.

References Cited in the file of this patent

UNITED STATES PATENTS

| | | |
|---|---|---|
| 2,558,707 | Janssen | June 26, 1951 |
| 2,718,634 | Hansen | Sept. 20, 1955 |
| 2,784,369 | Fenemore | Mar. 5, 1957 |
| 2,892,147 | Bell | June 23, 1959 |

OTHER REFERENCES

Dynamic Binary Counter by Leroy Packer, part 7, Convention Record of the March 23–26 IRE National Convention. Copyright April 1953, page 19, FIGURE 7 relied upon.

UNITED STATES PATENT OFFICE
CERTIFICATE OF CORRECTION

Patent No. 3,011,132 November 28, 1961

Karl Hinrichs et al.

It is hereby certified that error appears in the above numbered patent requiring correction and that the said Letters Patent should read as corrected below.

Column 3, line 22, for "valve" read -- value --; column 4, line 47, and column 5, line 56, first occurrence, for "impedance", each occurrence, read -- impedances --; column 8, lines 18 and 19, for "resistors" read -- resistor --; line 21, strike out "and".

Signed and sealed this 17th day of April 1962.

(SEAL)
Attest:

ESTON G. JOHNSON

Attesting Officer

DAVID L. LADD

Commissioner of Patents